United States Patent
Park et al.

(10) Patent No.: US 6,287,917 B1
(45) Date of Patent: Sep. 11, 2001

(54) PROCESS FOR FABRICATING AN MNOS FLASH MEMORY DEVICE

(75) Inventors: Stephen Keetai Park, Cupertino; Tim Thurgate, Sunnyvale; Bharath Rangarajan, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/392,675

(22) Filed: Sep. 8, 1999

(51) Int. Cl.[7] .............................................. H01L 21/8247
(52) U.S. Cl. ........................ 438/262; 438/258; 438/287
(58) Field of Search .................................... 438/216, 258, 438/261, 262, 263, 287, 302, 525

(56) References Cited

U.S. PATENT DOCUMENTS

| | | | |
|---|---|---|---|
| 4,455,742 | * 6/1984 | Williams et al. | 438/287 |
| 4,516,313 | * 5/1985 | Turi et al. | 438/287 |
| 5,190,887 | * 3/1993 | Tang et al. | 438/525 |
| 5,700,728 | * 12/1997 | Kuo et al. | 438/216 |

* cited by examiner

*Primary Examiner*—Chandra Chaudhari
(74) *Attorney, Agent, or Firm*—Amin & Turocy, LLP

(57) ABSTRACT

A process for fabricating an MNOS device includes the steps of forming a hardmask containing at least first and second openings over a core array area of a semiconductor substrate. An angle doping process is carried out to form halo regions in precise locations within the substrate at the edges of the first and second openings in the hardmask. Another doping process is carried out to form buried bit-lines in the substrate using the hardmask as a doping mask. Once the halo regions and the buried bit-lines are formed, the hardmask is removed and a composite dielectric layer is formed overlying the substrate. A gate layer is deposited to overlie the composite dielectric layer, and an etching process is carried out to form a control gate electrode and a charge storage electrode in the MNOS device

19 Claims, 3 Drawing Sheets

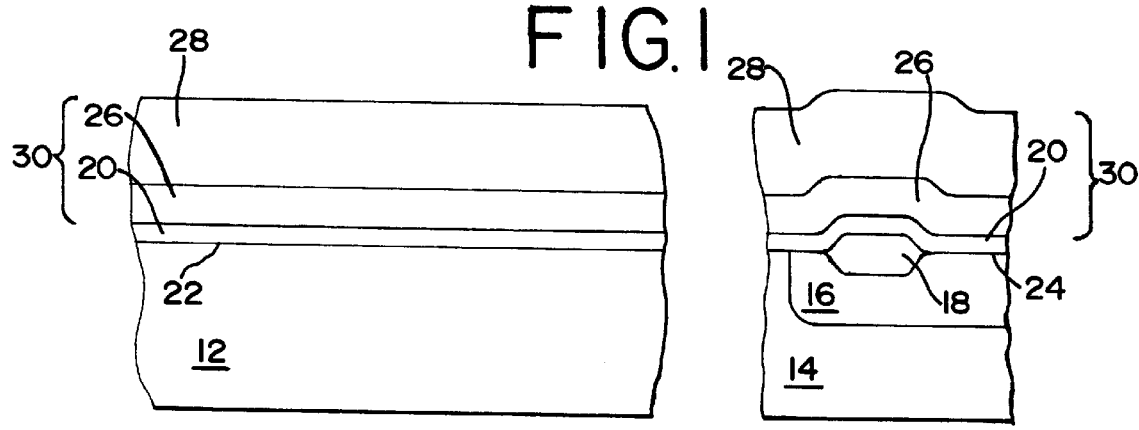
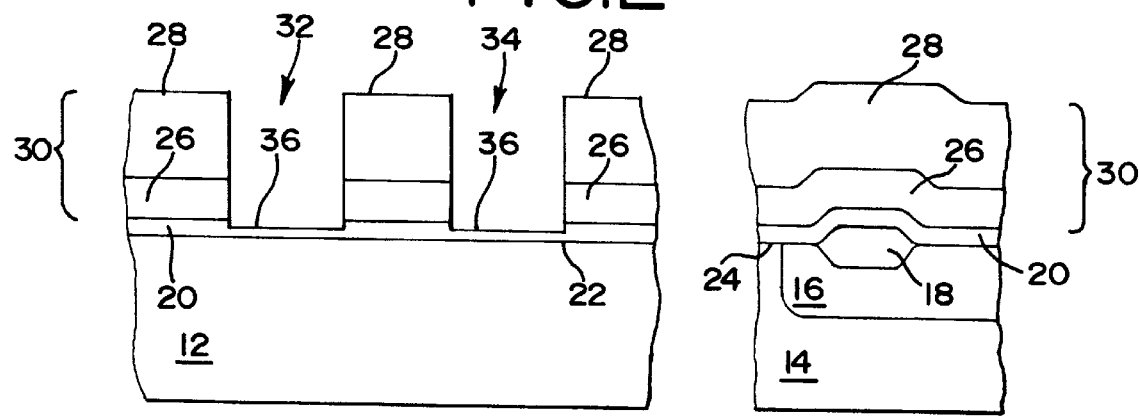
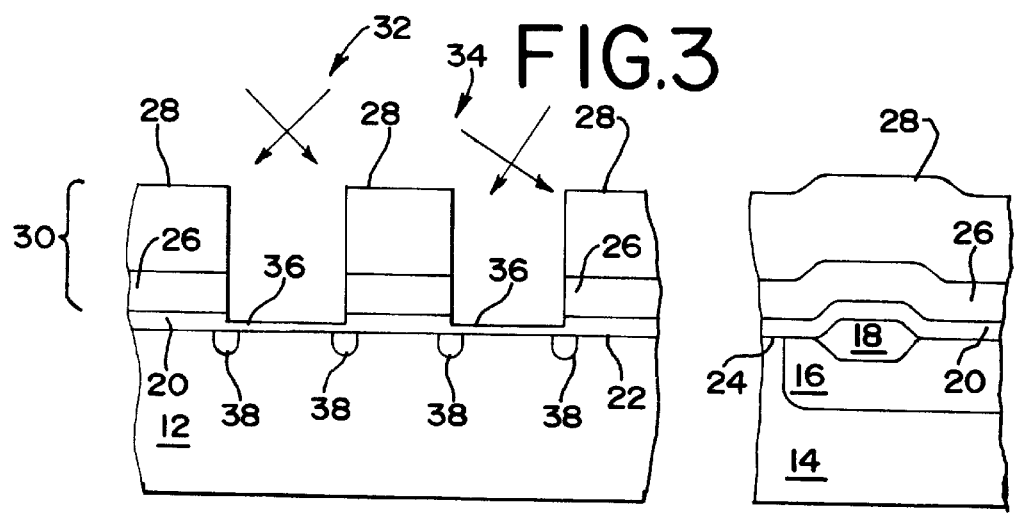

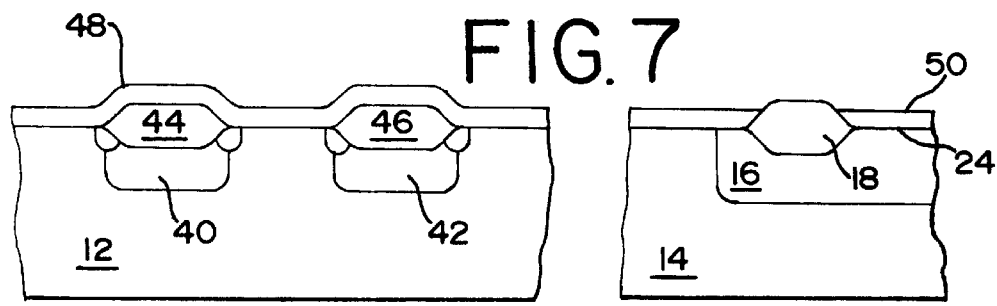
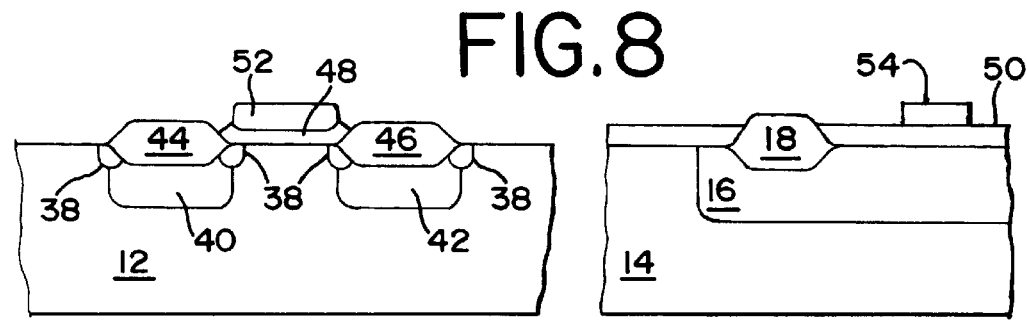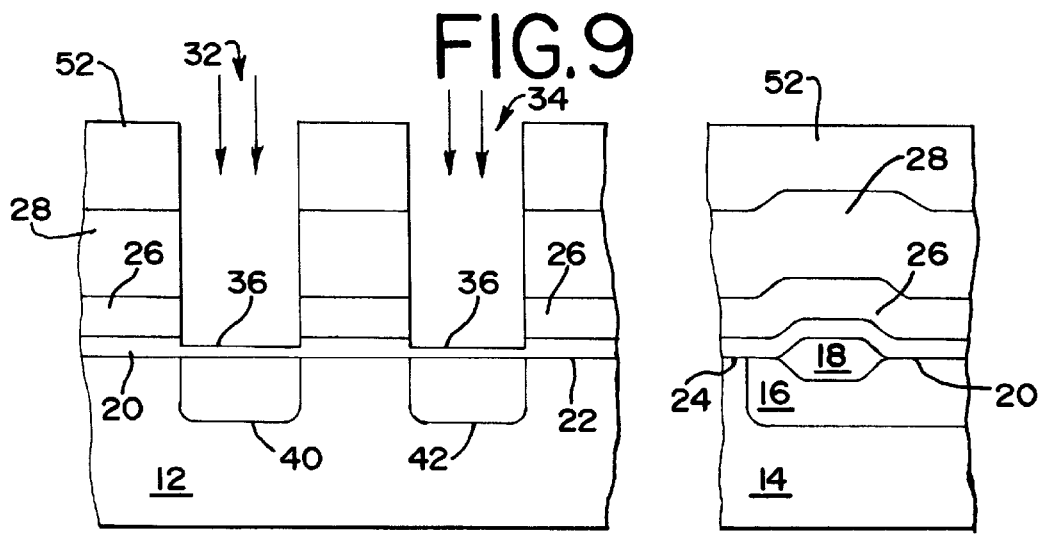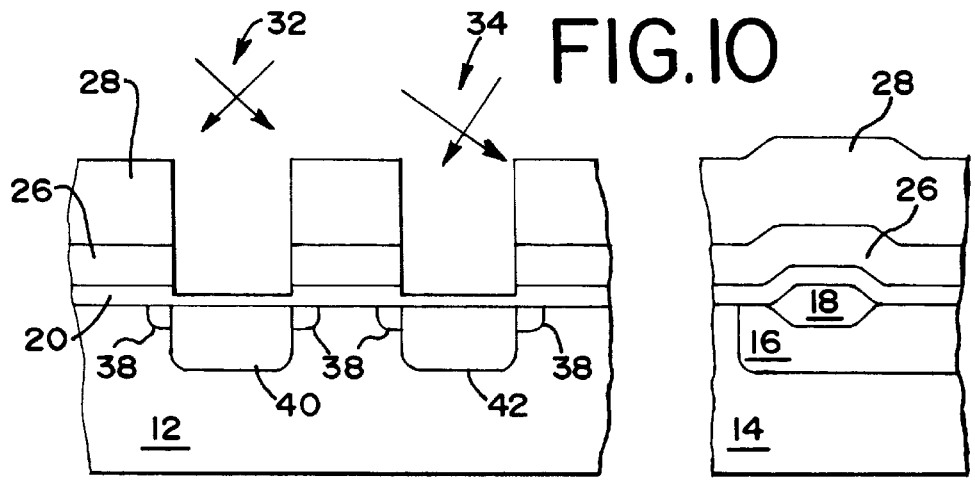

PROCESS FOR FABRICATING AN MNOS FLASH MEMORY DEVICE

BACKGROUND OF THE INVENTION

This invention relates, generally, to methods for fabricating semiconductor devices, and more particularly, to a process for fabricating an MNOS flash memory device.

BRIEF SUMMARY OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other nonvolatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride in combination with silicon dioxide is known to provide satisfactory dielectric separation between the control-gate electrode and the channel region of the enhancement transistor, while possessing electrical characteristics sufficient to store electrical charge.

One important dielectric material for the fabrication of the floating-gate electrode is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, the channel region of the floating-gate transition must have precisely defined charge sourcing regions. Accordingly, advances in fabrication technology are necessary to insure proper charge transfer to the ONO structures used in two-bit EEPROM devices.

BRIEF SUMMARY

The present invention is for a process for fabricating a semiconductor device, and in particular, an MNOS flash memory device that incorporates a hardmask for fabrication of buried bit-lines and halo regions within a semiconductor substrate. By incorporating a hardmask into the process flow, precise control over the formation of buried bit-lines and halo regions can be obtained. In addition to presenting favorable geometric characteristics for the formation of halo regions, the process of the invention also enables the incorporation of a thermal processing cycle after the formation of the halo regions and prior to the formation of the buried bit-lines. The application of thermal energy after introducing dopants to form the halo region diffuses dopants from the halo region to form a high integrity interface between the buried bit-line and the halo region. This is especially important where the width of the buried bit-lines is extremely small compared to the thickness of the masking layers used during formation of the halo region. Furthermore, the process of the invention advantageously delays the etching of an ONO layer until a gate electrode layer is formed to overlie the ONO layer. By avoiding the direct plasma etching of the ONO layer, an MNOS flash memory device can be fabricated with minimal charging damage to the ONC) layer in the core array area of the device.

In accordance with the invention, the process includes providing a semiconductor substrate having a surface and forming a buffer layer overlying the surface. A hardmask is formed on the buffer layer and contains at least first and second openings that reveal exposed portions of the buffer layer. Insulating regions are then formed in portions of the surface of the semiconductor substrate underlying the exposed portions of the buffer layer. The hardmask and the buffer layer are removed either before or after forming the insulating layer. A composite dielectric layer is then formed overlying the insulating regions and the surface of the semiconductor substrate.

BRIEF DESCRIPTION OF THE DRAWING

FIGS. 1–8 illustrate, in cross-section, processing steps in accordance with the invention; and FIGS. 9–10 illustrate, in cross-section, processing steps in accordance with another embodiment of the invention.

Figure 4:
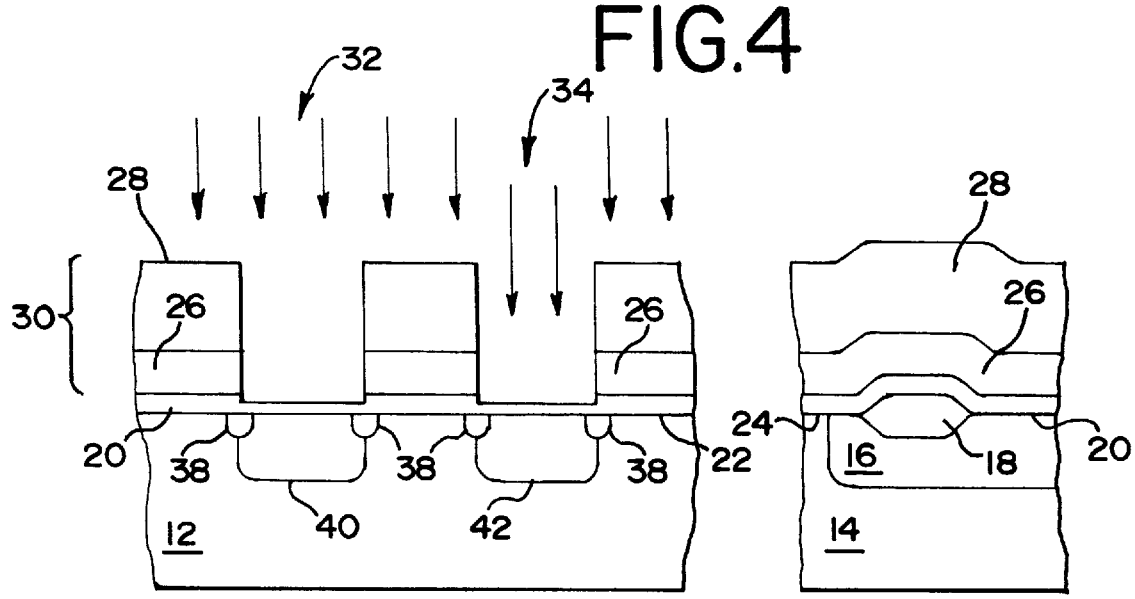

It will be appreciated that for simplicity of illustration not all figures have been drawn to scale. For example, some elements have been exaggerated relative to others. Additionally, where considered appropriate, reference numerals have been repeated among the figures to indicate corresponding elements.

DETAILED DESCRIPTION OF PREFERRED EMBODIMENTS

Shown in FIG. 1, in cross-section, are two sections of a semiconductor substrate having already undergone several processing steps in accordance with the invention. The semiconductor substrate includes a core array area 12 and a periphery area 14. Core array area 12 is the substrate region in which active device components of a flash memory cell will be fabricated. Periphery area 14 is a section of the semiconductor substrate in which devices that support the active cell of a flash memory device are fabricated. For example, charge pump circuitry and supply voltage transistors are fabricated in periphery area 14 in addition to signal input/output transistors, and other signal processing devices. A well region 16 and a field oxide region 18 reside in periphery area 14 to electrically isolate periphery devices from the active core devices.

In accordance with the invention, a process for fabricating an MNOS flash memory device includes the formation of a buffer layer 20 overlying a surface 22 of core array area 12 and a surface 24 of periphery area 14. Buffer layer 20 is an insulating material formed to protect surfaces 22 and 24 from contamination and damage that can potentially be caused by subsequent processing steps. In a preferred embodiment of the invention, buffer layer 20 is a silicon oxide material deposited by chemical-vapor-deposition (CVD) to overlie surfaces 22 and 24. Alternatively, buffer layer 20 can be a thermally grown silicon dioxide layer. Alternatively, buffer layer 20 can be another insulating material, such as silicon nitride, and the like.

After forming buffer layer 20, an intermediate layer 26 is deposited to overlie buffer layer 20. Intermediate layer 26 is preferably silicon nitride deposited by either CVD or plasma-enhanced-chemical-vapor-deposition (PECVD) to a thickness of about 500 to 5000 angstroms, and more preferably, to a thickness of about 1000 angstroms. In another embodiment, intermediate layer 26 can be a composite layer including layers of silicon oxide and silicon nitride.

After forming intermediate layer 26, a top layer 28 is formed to overlie intermediate layer 26. Top layer 28 can be a semiconductor material, such as polycrystalline silicon. In an alternative embodiment, top layer 28 can be silicon oxide deposited by CVD or PECVD processes or the like. Further, top layer 28 can be an insulating material, such as silicon oxide. In a preferred embodiment of the invention, top layer 28 is polycrystalline silicon formed by a CVD process or silicon oxide formed by CVD or PECVD to a thickness of about 1,000 to 10,000 angstroms, and more preferably about 5000 angstroms.

In accordance with the invention, intermediate layer 26 and top layer 28 are components of a hardmask 30. In addition to intermediate layer 26 and top layer 28, hardmask 30 can include additional layers of material other than those illustrated in FIG. 1. Further, hardmask 30 can be a single layer of material formed to overlie buffer layer 20. The number and material composition of the individual layers forming hardmask 30 are only limited by the ion stopping power and etch resistance of the material. As described below, subsequent processing steps are carried out to form implanted regions within core array area 12. Additionally, etching processes must be carried out prior to the implant process. The material of hardmask 30 must be etchable, yet possess sufficient ion stopping power to prevent the penetration of implanted ions through the hardmask material and into the substrate.

Once hardmask 30 is formed, a lithographic patterning and etching process is carried out to form first and second openings 32 and 34, as illustrated in FIG. 2. The etching process is carried out to remove exposed portions of top layer 28 and intermediate layer 26. The etching process is controlled so as to not completely etch buffer layer 20. Upon completion of the etching process, a thin portion 36 of buffer layer 20 remains overlying surface 22. Thin portion 36 protects surface 22 in core array area 12 from damage caused by the subsequent doping steps described below. In a preferred embodiment of the invention, the etching process is carried out, such that thin portion 36 has a thickness of preferably about 10 to about 500, and more preferably about 50 to about 100 angstroms. Those skilled in the art will appreciate that the thickness of thin portion 36 will depend upon various processing parameters, such as the particular type of dopant atom to be implanted, the implantation energy, the amount of charge dissipation available during the implant, the particular material composition of hardmask 30, and the like. Importantly, hardmask 30 is not etched in regions overlying periphery area 14. Hardmask 30 protects periphery area 14, and in particular, well region 16 from the effects of doping processes carried cut to dope core area 12.

Preferably, first and second openings 32 and 34 are formed by anisotropically etching hardmask 30. The anisotropic etching process forms substantially vertical sidewalls in openings 32 and 34. Precise control of the width of openings 32 and 34 is important for the high density fabrication of cell components in a flash memory device. Those skilled in the art will appreciate that the formation of openings 32 and 34 in preparation for creation of buried bit-lines is a critical dimension process requiring precise feature definition.

As illustrated in FIG. 3, following the formation of first and second openings 32 and 34, an angled doping process is carried out to form halo regions 38 in core array area 12. Preferably, halo implant regions 38 are formed by an angled ion implant process in which boron ions are introduced at a large tilt angle. An offset angle of incidence to normal is necessary to form halo regions 38 at the corners of openings 32 and 34.

Those skilled in the art will appreciate that the angle of incidence necessary to form halo regions 38 depends upon the aspect ratio of openings 32 and 34. For example, where the lateral dimension of first and second openings 32 and 34 is very small, and the thickness of hardmask 30 is very large, the aspect ratio will also be very large. As the aspect ratio increases, the angle of incidents must also increase in order to place dopant at the corners of first and second openings 32 and 34.

A particular advantage of the present invention includes the ability to fabricate hardmask 30 to a relatively small thickness. As the thickness of hardmask 30 is reduced, the aspect ratio of openings 32 and 34 also becomes less. By providing a hardmask having a relatively small thickness, greater processing latitude is available for the fabrication of halo regions 38.

This is because the angle of incidence can be reduced with respect to the normal, which insures better control over the doping concentration in halo implant regions 38. For example, where hardmask 30 has a thickness of about 3000 to about 8000, the angle of incidents can be at least about 7°. In a preferred embodiment of the invention, a boron ion implant is carried out at an angle of incidents of at least about 7° with respect to normal. Preferably, boron ion implantation is carried out with the dose of about 1.0E12 ions/cm$^2$ to about 1.0E14/cm$^2$, and more preferably, about 1.0E13 ions/cm$^2$ in halo regions 38.

After forming halo regions 38, a second doping process is carried out to form buried bit-lines 40 and 42, as illustrated in FIG. 4. In a preferred embodiment, a conventional ion implantation process is carried out to implant an n-type dopant, such as arsenic or phosphorous, into core array area 12. Preferably, buried bit-lines 40 and 42 are formed by implanting a dose of about 1.0E14/ions cm$^2$ to about 8.0E15 ions/cm$^2$, and more preferably, about 5.0E15 ions/cm$^2$.

In accordance with the invention, thermal energy can be applied to core array area 12 after forming halo regions 38, but prior to the formation of buried bit-lines 40 and 42. By applying thermal energy, halo regions 38 can 30 be diffused in a controlled manner to precisely tailor the junction interface of halo regions 38 in core array area 12. The controlled diffusion of halo regions 38 insures that they will extend in a lateral direction a sufficient distance to provide a charge source for the MNOS flash memory device. Those skilled in the art will appreciate that halo regions 38 must be precisely formed in order to function as a source of charge during programming of an MNOS flash memory device. By using a hardmask, rather than a carbon-containing resist material to mask the doping processes, a thermal treatment step can be carried out prior to forming buried bit-lines 40 and 42. By laterally diffusing halo regions 38 prior to forming buried bit-lines 40 and 42, and undesirable overlap of buried bit-lines 40 and 42 can be avoided. The application of thermal energy can be carried out by rapid-thermal-annealing (RTA) or by conventional furnace annealing.

Figure 5:
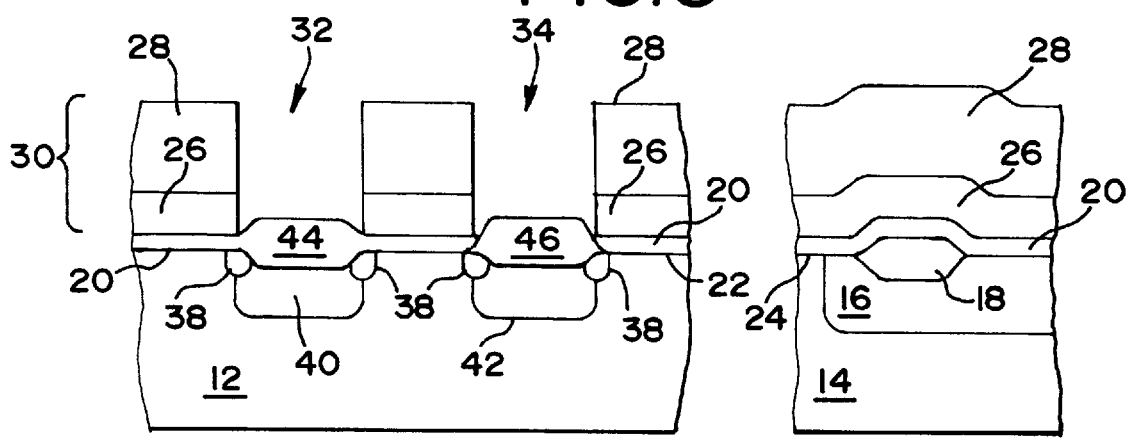

Next, processing is carried out to form bit-line oxide regions 44 and 46, as illustrated in FIG. 5. In accordance with the invention, because a hardmask material is used rather than a carbon-containing resist, an oxidation process can be carried out to form bit-line oxide regions 44 and 46 without removal of hard-mask 30. Alternatively, hardmask 30 can be removed prior to formation of bit-line oxide regions 44 and 46. The versatility of the process of the invention provides a distinct advantage in the fabrication of MNOS flash memory devices. Bit-line oxide regions 44 and 46 are formed in first and second openings 32 and 34 at surface 22 of core array 12. During the oxidation process, thin portions 36 of buffer layer 20 are consumed and become part of bit-line oxide regions 44 and 46.

In an alternative embodiment of the invention, bit-line oxide regions 44 and 46 can be formed by processes other than thermal oxidation. For example, bit-line oxide regions 44 and 46 can be formed by a trench isolation process, and the like. Further, bit-line oxide regions 44 and 46 can be any insulating material formed by various deposition processes.

Figure 6:
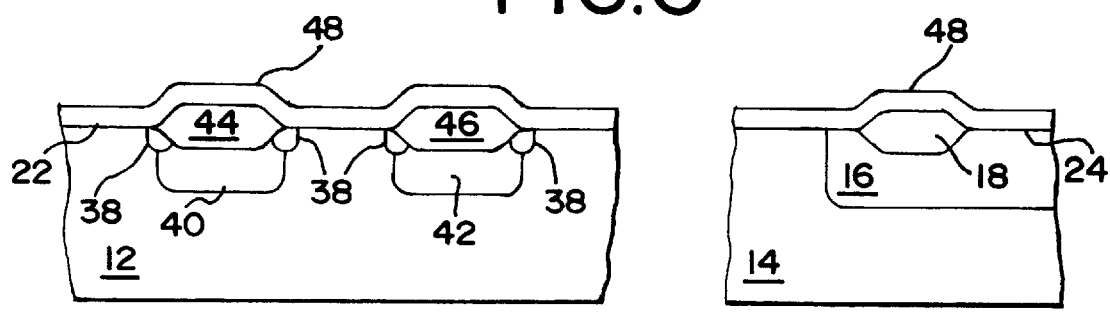

Referring to FIG. 6, the inventive process continues with the removal of hardmask 30 and buffer layer 20. The hardmask layers are completely removed from surface 22 of core array area 12 and surface 24 of periphery area 14. Next, a composite dielectric layer 48 is formed to overlie surfaces 22 and 24, bit-line oxide regions 44 and 46, and field oxide region 18. Preferably, composite dielectric layer 48 includes a layer of material capable of retaining electrical charge in isolated areas of the material. In a preferred embodiment of the invention, composite dielectric layer 48 is an ONO layer that includes a first silicon oxide layer overlying surfaces 22 and 24, a silicon nitride layer overlying the first silicon oxide layer, and a second silicon oxide layer overlying the silicon nitride layer. The fabrication of the ONO layer can be carried out by thermally growing a silicon dioxide layer on surfaces 22 and 24, followed by a CVD process to form the silicon nitride layer, followed by a CVD process to form the second silicon oxide layer. Alternatively, processes, such as nitridation of silicon oxide can be used to form the ONO layer.

Those skilled in the art will appreciate that the composite dielectric layer must be fabricated such that charge can be injected into a charge-storage layer within the composite dielectric layer at voltages typically used for operation of flash memory devices. In a preferred embodiment of the invention, the first silicon oxide layer has a thickness of about 10 angstroms to about 300 angstroms, and more preferably, about 80 angstroms, and more preferably, about the silicon nitride layer has a thickness of preferably about 10 angstroms to 300 angstroms, and more preferably, about 150 Å, and the second silicon oxide layer has a thickness of preferably about 10 angstroms to about 300 angstroms, and more preferably, about 60 angstroms. However, those skilled in the art will appreciate that various thicknesses of individual layers within composite dielectric layer 48 can be formed depending upon the programming voltages employed in a particular MNOS flash memory device.

As illustrated in FIG. 7, after forming composite dielectric layer 48, a lithographic mask (not shown) is formed to overlie portions of composite dielectric layer 48 in core area 12. Then, portions of composite dielectric layer 48 in periphery area 14 are etched away. Then, the lithographic mass is removed and an oxidation process is carried out to form a gate oxide layer 50 overlying surface 24.

After forming gate oxide layer 50, a gate electrode layer is deposited and etched to form gate electrodes 52 and 54, as illustrated in FIG. 8. Gate electrodes 52 and 54 can be formed from any of several gate electrode materials, such as polycrystalline silicon, amorphous silicon, refractory metal silicide, refractory metal, and the like. Those skilled in the art will appreciate that the resistivity of gate electrode 52 can be adjusted as necessary to enable proper capacitive coupling with composite dielectric layer 48.

An alternative processing embodiment of the invention is illustrated, in cross-section, in FIGS. 9 and 10. The process illustrated in FIGS. 9 and 10 can be employed where the lateral dimensions of buried bit-lines 40 and 42 are relatively large compared to the previous embodiment. For example, where the lateral dimension of the buried bit-lines is about 0.3 to about 1.0 µm microns, and the pitch dimension of first and second openings 32 and 34 is about 0.5 to about 0.8 microns. A conventional resist 52 can be used during formation of buried bit-lines 40 and 42. To facilitate precise formation of halo regions 38, a doping process is carried out to form buried bit-lines 40 and 42 using resist 52 as a doping mask. In similarity with the previous embodiment, an n-type dopant, such as arsenic or phosphorous can be implanted into core array 12 to form buried bit-lines 40 and 42.

Next, resist layer 52 is removed and an angle doping process is carried out to form halo regions 38. By removing resist layer 52 prior to performing the angle doping process, halo regions 38 can be precisely placed at the corners of first and second openings 32 and 34. By removing resist layer 52, the aspect ratio of first and second openings 32 and 34 is reduced. At a lower aspect ratio, the restraints on the angle of incidents of the doping process used to form halo regions 38 is somewhat relaxed. Accordingly, a high degree of control can be maintained during the formation of halo regions 38 in core array area 12.

Thus, it is apparent that there has been described, in accordance with the invention, a process for fabricating an MNOS flash memory device, that fully provides the advantages set forth above. Those skilled in the art will recognize that variations and modifications of the invention are possible.

For example, various processing methods, such as salicide processing, magnetically enhanced reactive ion etching, spin-on-glass processing, and the like can be used. Accordingly, all such variations and modifications are intended to be incorporated in the present invention.

What is claimed is:

1. A process for fabricating a semiconductor device comprising the steps of:

providing a semiconductor substrate having a surface;

forming a buffer layer overlying the surface of the semiconductor substrate;

forming a hardmask on the semiconductor substrate, wherein the hardmask provides at least first and second openings revealing exposed portions of the buffer layer;

forming insulating regions in portions of the surface of the semiconductor substrate underlying the exposed portions of the buffer layer;

removing the hardmask and the buffer layer either before or after forming the insulating regions; and forming a composite dielectric layer overlying the insulating regions and the surface of the semiconductor substrate, wherein the step of forming insulating regions comprises forming bit-line oxide regions.

2. The process of claim 1 further comprising the step of introducing a dopant of a first conductivity type into the semiconductor substrate at an angle of incidence of at least about 7° using the at least first and second openings as a doping mask.

3. The process of claim 2 further comprising the step of introducing a dopant of a second conductivity type into the semiconductor substrate using the at least first and second openings as a doping mask.

4. The process of claim 3 further comprising the step of applying thermal energy to the semiconductor substrate after the step of introducing the dopant of the first conductivity type and before the step of introducing the dopant of the second conductivity type.

5. The process of claim 4, wherein the step of applying thermal energy comprises using a method selected from the group consisting of rapid thermal annealing and convection furnace annealing.

6. The process of claim 1, wherein the step of introducing a dopant of a first conductivity type into the semiconductor substrate at an angle of incidence comprises introducing the dopant at an angle of at least about 7°.

7. The process of claim 1, wherein the step of forming a hardmask comprises forming a layer selected from the group consisting of polycrystalline silicon, refractory metal silicide, and silicon oxide.

8. The process of claim 7, wherein the hardmask further comprises one or more layers selected from the group consisting of silicon nitride and silicon oxide.

9. The process of claim 1, wherein the step of forming a composite dielectric layer comprises forming an ONO layer.

10. The process of claim 1, wherein the step of forming a hardmask comprises forming a hardmask having a thickness of about 1000 angstroms to about 10000 angstroms.

11. A process for fabricating an MNOS flash memory device comprising the steps of:

providing a substrate having a surface;

forming a buffer layer overlying the surface of the semiconductor substrate;

forming a hardmask on the semiconductor substrate, wherein the hardmask provides at least first and second openings revealing exposed portions of the buffer layer;

forming halo implant regions in the semiconductor substrate using the at least first and second openings as a doping mask;

forming buried bit-lines in the substrate using the at least first and second openings as a doping mask;

forming bit-line oxide layers in portions of the surface of the semiconductor substrate underlying the exposed portions of the buffer layer;

removing the hardmask and the buffer layer either before or after forming the bit-line oxide layers; and forming an ONO layer overlying the bit-line oxide layers and the surface of the semiconductor substrate.

12. The process of claim 11 further comprising the steps of:

forming a gate layer overlying the ONO layer; and patterning the gate layer and the ONO layer to form gate electrodes.

13. The process of claim 11 further comprising the step of annealing the semiconductor substrate after the step of forming halo implant regions and before the step of forming buried bit-lines.

14. The process of claim 11, wherein the step of forming a hardmask comprises forming a layer selected from the group consisting of polycrystalline silicon, refractory metal silicide, and silicon oxide.

15. The process of claim 14, wherein the hardmask further comprises one or more layers selected from the group consisting of silicon nitride and silicon oxide.

16. A process for fabricating an MNOS flash memory device comprising the steps of:

providing a substrate having a core surface region;

forming a buffer layer overlying the core surface region of the semiconductor substrate;

forming a hardmask on the semiconductor substrate, wherein the hardmask provides at least first and second openings revealing exposed portions of the buffer layer;

forming halo implant regions in the semiconductor substrate using the at least first and second openings as a doping mask;

forming buried bit-lines in the substrate using the at least first and second openings as a doping mask either before of after the step of forming halo implant regions;

forming bit-line oxide layers in portions of the core surface region of the semiconductor substrate underlying the exposed portions of the buffer layer;

removing the hardmask and the buffer layer either before or after forming the bit-line oxide layers; and forming an ONO layer overlying the bit-line oxide layers and the surface of the semiconductor substrate.

17. The process of claim 16 further comprising the steps of:

providing a semiconductor substrate having a periphery region;

forming a field oxide region in the periphery region concomitant with the step of forming bit-line oxide regions;

forming the ONO layer overlying the periphery region and the field oxide region;

selectively removing the ONO layer overlying the periphery region; and growing a gate oxide layer overlying the periphery region.

18. The process of claim 17 further comprising the steps of:

forming a gate layer overlying the ONO layer and the gate oxide layer; and patterning the gate layer, the ONO layer, and the gate oxide layer to form gate electrodes.

19. The process of claim 16, wherein the step of forming a hardmask comprises the steps of:

forming a layer of silicon nitride overlying the buffer layer;

forming an intermediate layer selected from the group consisting of polycrystalline silicon, refractory metal silicide, and silicon oxide overlying the layer of silicon nitride; and forming a layer of resist material overlying the intermediate layer.

* * * * *